US 12,255,524 B2

(12) United States Patent
Kotula et al.

(10) Patent No.: US 12,255,524 B2
(45) Date of Patent: Mar. 18, 2025

(54) ISOLATED GATE DRIVER FOR BIDIRECTIONAL FET PAIR

(71) Applicant: Enphase Energy, Inc., Petaluma, CA (US)

(72) Inventors: Tomasz Janusz Kotula, Christchurch (NZ); Patrick Lyle Chapman, Austin, TX (US); Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 304 days.

(21) Appl. No.: 17/846,876

(22) Filed: Jun. 22, 2022

(65) Prior Publication Data

US 2023/0006537 A1  Jan. 5, 2023

Related U.S. Application Data

(60) Provisional application No. 63/216,974, filed on Jun. 30, 2021.

(51) Int. Cl.
*H02M 1/08* (2006.01)
*H02M 1/088* (2006.01)
(Continued)

(52) U.S. Cl.
CPC ............ *H02M 1/08* (2013.01); *H02M 1/088* (2013.01); *H02M 3/33584* (2013.01);
(Continued)

(58) Field of Classification Search
CPC ........ H02M 1/08; H02M 1/088; H02M 1/083; H02M 1/092; H02M 7/757; H02M 7/4815; H02M 3/01
See application file for complete search history.

(56) References Cited

U.S. PATENT DOCUMENTS

2007/0221267 A1  9/2007 Fornage
2009/0147544 A1* 6/2009 Melanson ............... H02M 1/08
363/21.01
(Continued)

FOREIGN PATENT DOCUMENTS

EP         1227588 A1    7/2002
KR    2017-0143324 A    12/2017
WO  WO-2021049720 A1 * 3/2021 .............. H02M 1/08

OTHER PUBLICATIONS

PCT International Search Report and Written Opinion for Application No. PCT/US2022/034656 dated Oct. 21, 2022, 11 pgs.

*Primary Examiner* — Jue Zhang
*Assistant Examiner* — Jye-June Lee
(74) *Attorney, Agent, or Firm* — Moser Taboada

(57) ABSTRACT

A system for driving four-quadrant (4Q) switches of a power converter is provided herein and comprises a transformer driver module, a first gate driver module and a second gate driver module coupled to the transformer driver module via a first isolation transformer and a second isolation transformer, respectively, for receiving both switch signal information and power, and a first bidirectional switch and a second bidirectional switch coupled to the first gate driver module and the second gate driver module and to one another for driving the first bidirectional switch and the second bidirectional switch based on the switch signal information.

20 Claims, 11 Drawing Sheets

(51) Int. Cl.
  *H02M 3/335*  (2006.01)
  *H02M 7/48*  (2007.01)
  *H02M 7/757*  (2006.01)
  *H02M 5/22*  (2006.01)

(52) U.S. Cl.
  CPC ......... *H02M 7/4815* (2021.05); *H02M 7/757* (2013.01); *H02M 5/22* (2013.01)

(56) References Cited

U.S. PATENT DOCUMENTS

| | | |
|---|---|---|
| 2010/0026208 A1 | 2/2010 | Shteynberg et al. |
| 2014/0159811 A1 | 6/2014 | Chen |
| 2015/0137871 A1* | 5/2015 | Takano ................... H02M 1/08 327/389 |
| 2020/0228109 A1* | 7/2020 | Bachhuber ......... H03K 17/0828 |

* cited by examiner

ISOLATED GATE DRIVER FOR BIDIRECTIONAL FET PAIR

CROSS-REFERENCE TO RELATED APPLICATIONS

The present application claims the benefit of and priority to U.S. Provisional Application Ser. No. 63/216,974, filed on Jun. 30, 2021, the entire contents of which is incorporated herein by reference.

BACKGROUND

Field of the Disclosure

Embodiments of the present disclosure relate generally to gate drivers and, more particularly, to an isolated gate driver system for driving a bidirectional switch comprising field-effect transistors (FETs).

Description of the Related Art

A gate driver is a power amplifier that accepts a low-power input and produces the appropriate high-current gate drive for a power transistor such as a power metal-oxide-semiconductor field-effect transistor (MOSFET). Isolated gate drivers provide electrical isolation as well as strong gate drive capability, which is often required for safety and robustness in many system architectures.

In some devices, such as a power converter, switching devices driven by a gate driver may exist on the high-voltage side of the device while the control electronics are on the low-voltage side of the device. In such topologies, power for gate drivers may be derived from the high-voltage side; however, these techniques are subject to issues such as challenges harvesting power prior to initial switch activation (i.e., during device startup), and severe voltage transients. Further, circuit components used in harvesting power on the high-voltage side may contribute to energy losses during switch operation.

Therefore, there is a need in the art for an improved isolated gate driver system.

SUMMARY

In accordance with at least some aspects of the disclosure, a system for driving four-quadrant (4Q) switches of a power converter comprises a transformer driver module, a first gate driver module and a second gate driver module coupled to the transformer driver module via a first isolation transformer and a second isolation transformer, respectively, for receiving both switch signal information and power, and a first bidirectional switch and a second bidirectional switch coupled to the first gate driver module and the second gate driver module and to one another for driving the first bidirectional switch and the second bidirectional switch based on the switch signal information.

In accordance with at least some aspects of the disclosure, a power converter comprises a low-voltage side and a high voltage side separated by a transformer, an isolated gate driver system connected to the low-voltage side via a controller and to the high voltage side, the isolated gate driver system comprising a transformer driver module that connects to the controller, a first gate driver module and a second gate driver module connected to a cycloconverter on the high voltage side and coupled to the transformer driver module via a first isolation transformer and a second isolation transformer, respectively, for receiving both switch signal information and power, and a first bidirectional switch and a second bidirectional switch coupled to the first gate driver module and the second gate driver module and to one another for driving the first bidirectional switch and the second bidirectional switch based on the switch signal information.

In accordance with at least some aspects of the disclosure, a method for controlling a power converter comprises receiving, at a transformer driver module, switch signal information, transmitting the switch signal information signal via at least one of a first isolation transformer or a second isolation transformer to a corresponding first gate driver module or second gate driver module, receiving at the first gate driver module or the second gate driver module a drain voltage signal representing a drain voltage of a corresponding first FET switch or a second FET switch, and based on the switch signal information and the drain voltage signal controlling at least one of the first FET switch or the second FET switch during each switching cycle.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to an isolated gate driver system for driving field-effect transistor (FET) switch pairs arranged as four-quadrant (4Q) switches. The isolated gate driver system allows a single isolator to drive two FETs, such as MOSFETs, and utilizes local FET voltage sensing (current FET polarity) to eliminate measurement and processing delays. The isolated gate driver system enables both signal and power to be transmitted over an isolation barrier, which in various embodiments is provided by a low-cost, high-reliability pulse transformer.

In one or more embodiments, two FET switches are coupled back-to-back in each leg of a single-phase cycloconverter; in such embodiments, one of the FETs in each cycloconverter leg is continuously ON for almost all of a first half of an AC mains cycle, and the other FET is continuously ON for almost all of the second half of the AC mains cycle. By sensing the drain voltages at each of the FETs, the isolated gate driver system is able to determine which FET in each 4Q switch should remain ON for nearly all of each AC mains cycle. The isolated gate driver system is thus able to recreate a "continuously ON for nearly half a mains cycle" function using only one gate signal (i.e., the gate signal of the non-continuously activated FET in the 4Q switch). The recreated gate signal has a 50% duty cycle, enabling the isolated gate driver system to use a gate drive transformer to provide isolation as well as to transfer both power and gate signaling. As such, the isolated gate driver system requires only a single isolated channel per cycloconverter leg.

Additionally, the isolated gate driver system detects the desired gate signal and the voltage across a pair of unidirectional switches that form a bidirectional switch; using the detected information, the isolated gate driver system can identify which unidirectional switch in the pair to activate.

In one or more embodiments, the isolated gate driver system comprises a four-channel driver module, pulse transformer gate drivers, and gate driver modules, where the four-channel driver module and the gate driver modules may be implemented as application-specific integrated circuits (ASICs).

Figure 1:
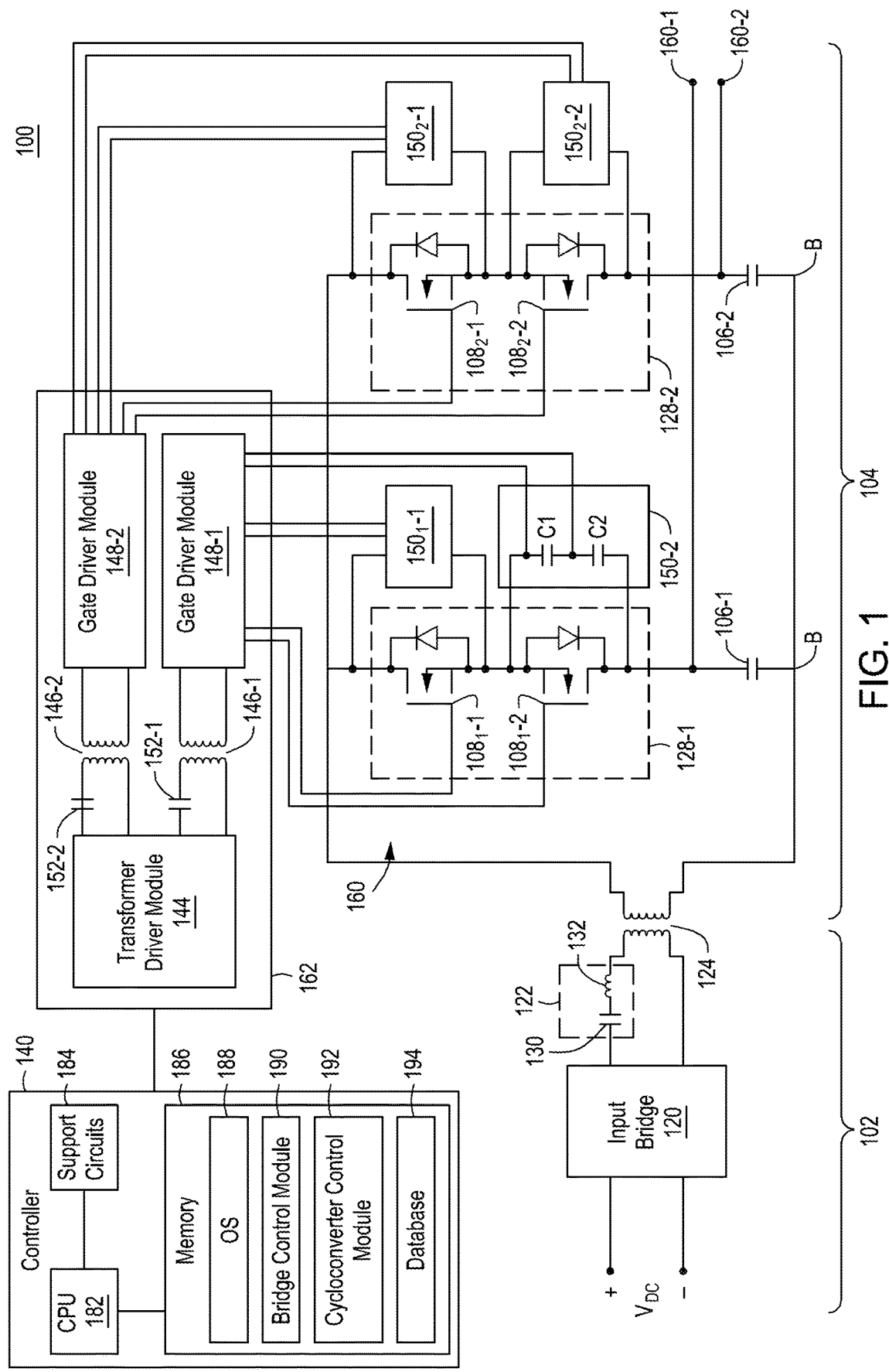
FIG. 1 is a block diagram of a power converter in accordance with embodiments of the present disclosure.

FIG. 1 is a block diagram of a power converter 100 in accordance with embodiments of the present disclosure. The power converter 100 ("converter 100") is a single-phase bidirectional DC-AC resonant converter comprising a low-voltage side 102 and a high-voltage side 104 separated by a transformer 124. The power converter 100 further comprises a controller 140 and an isolated gate driver system 162 for operably controlling the converter 100 as described in detail below.

The low-voltage side 102 comprises a resonant circuit 122 coupled between an input bridge 120 and a primary winding of the transformer 124. The input bridge 120 comprises multiple switches (e.g., MOSFETS) configured as an H-bridge (full or half bridge), and receives a DC input from a DC voltage source, such as one or more renewable energy sources (e.g., photovoltaic (PV) modules, wind farms, hydroelectric systems, or the like), batteries, fuel cells, or any suitable source of DC power.

The resonant circuit 122 comprises a capacitor 130 coupled in series with an inductor 132, although in other embodiments the resonant circuit 122 may be a different type of resonant circuit and/or coupled in a different topology within the power converter 100 (e.g., a parallel resonant circuit coupled across the input bridge 120). In some embodiments, the capacitor 130 may be moved from the positions depicted on the low-voltage side to the high-voltage side and replace the capacitors 106-1 and 106-2. The high-frequency output signal from the resonant circuit 122 is coupled to the primary winding of the transformer 124.

The high-voltage side 104 comprises the secondary winding of the transformer 124 coupled across a cycloconverter 160 comprising four-quadrant (4Q) fully bidirectional switches 128-1 and 128-2 (collectively referred to as 4Q switches 128). The 4Q switches 128-1 and 128-2 are coupled to capacitors 106-1 and 106-2, respectively, to form first and second legs A and B respectively. The first and second legs A and B are coupled in parallel, with a first AC output terminal 160-1 coupled between the 4Q switch 128-1 and the capacitor 106-1, and a second AC output terminal 160-2 coupled between the 4Q switch 128-2 and the capacitor 106-2. As depicted in FIG. 1, the high-voltage side 104 comprises a half-bridge cycloconverter; in some other embodiments, a full-bridge cycloconverter may be used in place of the half-bridge cycloconverter. In such embodiments, the capacitors 106-1 and 106-2 are replaced by four-quadrant fully bidirectional switches such as the 4Q switches 128.

The 4Q switches 128-1 and 128-2 are each fully-controlled four-quadrant switches comprising two source-connected metal-oxide-semiconductor field-effect transistor (MOSFET) switches, although in alternative embodiments different types of field-effect transistors (FETs) and/or 4Q switch configurations may be used.

The 4Q switch 128-1 comprises a switch $108_1$-1 (FET) coupled back-to-back to a switch $108_1$-2 (e.g., FET switch pairs). The switch $108_1$-1 is coupled via its drain terminal to a first terminal of the secondary winding of the transformer 124, and its source terminal is coupled to the source terminal of the switch $108_1$-2. The drain terminal of the switch $108_1$-2 is coupled to both a first terminal of the capacitor 106-1 and the first AC output terminal 160-1. A second terminal of the capacitor 106-1 is coupled to a second terminal of the transformer 124.

Analogous to the 4Q switch 128-1, the 4Q switch 128-2 comprises a switch $108_2$-1 (FET) coupled back-to-back to a switch $108_2$-2 (e.g., FET switch pairs). The switch $108_2$-1 is coupled via its drain terminal to the first terminal of the secondary winding of the transformer 124, and its source terminal is coupled to the source terminal of the switch $108_2$-2. The drain terminal of the switch $108_2$-2 is coupled to both a first terminal of the capacitor 106-2 and the second AC output terminal 160-2. A second terminal of the capacitor 106-2 is coupled to the second terminal of the secondary winding of the transformer 124.

Drain voltage sensors $150_1$-1, $150_1$-2, $150_2$-1, and $150_2$-2, collectively referred to as drain voltage sensors 150, are respectively coupled across the switches $108_1$-1, $108_2$-1, $108_2$-1, and $108_2$-2. As shown for the drain voltage sensor $150_1$-2, each drain voltage sensor 150 comprises capacitors C1 and C2 coupled in series to form a capacitive divider connected across the drain and source terminals of the corresponding FET switch 108. The drain voltage sensors 150 couple a voltage, equal to the ratio of the capacitive divider multiplied by the drain-source voltage VDS of the corresponding FET switch 108, to the gate driver modules 148 for monitoring the FET drain voltage, which is used in determining switching signaling, as described further below. In some embodiments, the capacitors C1 and C2 may be on the order of 560 pF and 10 pF, respectively.

The isolated gate driver system 162 is further coupled to the 4Q switches 128-1 and 128-2 (i.e., to the gate terminals of the FET switch pairs, e.g., switches $108_1$-1, $108_1$-2, $108_2$-1, and $108_2$-2) for operably controlling the switches. The isolated gate driver system 162 comprises a transformer driver module 144, isolation transformers 146-1 and 146-2 (collectively referred to as isolation transformers 146), and gate driver modules 148-1 and 148-2 (collectively referred to as gate driver modules 148). The transformer driver module 144 is coupled to the primary winding of the isolation transformer 146-1 (e.g., a pulse transformer), via a capacitor 152-1, and to the primary winding of the second isolation transformer 146-2 (e.g., a pulse transformer) via a capacitor 152-2 (e.g., corresponding capacitors). In some embodiments, the capacitors 152-1 and 152-2 are on the order of 200 nF. The secondary windings of the isolation transformer 146-1 and the second isolation transformer 146-2 are coupled to the gate driver modules 148-1 and 148-2, respectively. The gate driver module 148-1 is coupled to the gates of the switches $108_1$-1 and $108_1$-2 (which may be referred to as switches $108_1$-1/$108_1$-2) and the drain voltage sensors 150-1 and 150-2; the gate driver module 148-2 is coupled to the gates of the switches $108_2$-1 and $108_2$-2 (which may be referred to as switches $108_2$-1/$108_2$-2) and the drain voltage sensors 150-1 and 150-2.

In accordance with embodiments of the present disclosure, the isolated gate driver system 162 and the drain voltage sensors 150 form an isolated gate driver system for driving the FET switches 108 such that a single isolator drives two FET switches 108 (i.e., one isolator per cycloconverter leg) as described herein.

The controller 140 is coupled to the input bridge 120 and the isolated gate driver system 162, and comprises at least one central processing unit (CPU) 182 (which may comprise one or more conventionally available microprocessors or microcontrollers) coupled to each of a memory 186 and support circuits 184 (i.e., well known circuits used to promote functionality of the CPU 116, such as a cache, power supplies, clock circuits, buses, input/output (I/O) circuits, and the like). The controller 140 may be implemented using a general purpose computer that, when executing particular software, becomes a specific purpose computer for performing various embodiments of the present disclosure. In one or more embodiments, the CPU 182 may be a microcontroller comprising internal memory for storing controller firmware that, when executed, provides the controller functionality described herein. In some embodiments, the controller 140 may additionally or alternatively comprise one or more application specific integrated circuits (ASICs) for performing one or more of the functions described herein.

The memory 186, sometimes referred to as main memory, may comprise random access memory, read only memory, removable disk memory, flash memory, and various combinations of these types of memory and may, in part, be used as cache memory or buffer memory. The memory 186 generally stores an operating system (OS) 188, such as one of a number of available operating systems for microcontrollers and/or microprocessors (e.g., LINUX, Real-Time Operating System (RTOS), and the like). The memory 186 further stores non-transient processor-executable instructions and/or data that may be executed by and/or used by the CPU 182. These processor-executable instructions may comprise firmware, software, and the like, or some combination thereof.

The power converter 100 may comprise one or more additional components (not shown) that measure voltage and/or current values at various points and provide the measured values to the controller 140 for determining converter control. For example, the power converter 100 may comprise a DC current and/or voltage sampler coupled to the input bridge 120, an AC line voltage sampler coupled to the first AC output terminal 160-1 and the second AC output terminal 160-2, and the like.

The memory 186 stores various forms of application software, such as a bridge control module 190 for driving the input bridge 120, and a cycloconverter control module 192 for determining and coupling the appropriate signals to the isolated gate driver system 162 to achieve the desired switching states for the 4Q switches 128-1 and 128-2. The memory 186 additionally stores a database 194 for storing various data related to controlling the power converter 100. In various embodiments, the bridge control module 190, the cycloconverter control module 192, and the database 126, or portions thereof, may be implemented in software, firmware, hardware, or a combination thereof.

Figure 2:
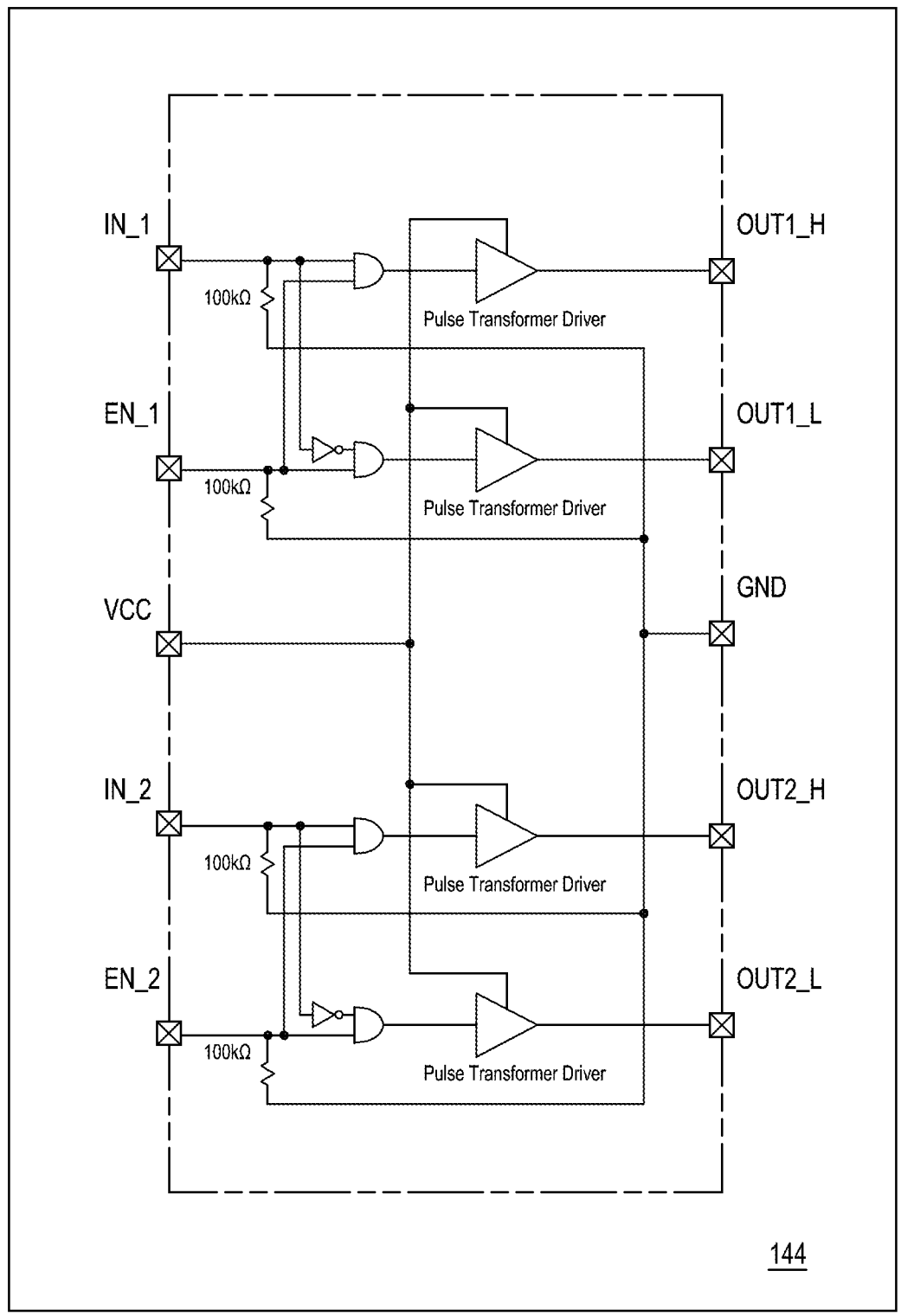
FIG. 2 is a block diagram of a transformer driver module in accordance with embodiments of the present disclosure.

FIG. 2 is a block diagram of a transformer driver module 144 in accordance with embodiments of the present disclosure. As described above, the transformer driver module 144 is coupled to the primary windings of the isolation transformers 146-1 and 146-2 for driving the isolation transformers 146-1 and 146-2.

The transformer driver module 144 comprises input terminals IN_1, EN_1, IN_2, and EN_2, and output terminals OUT1_H, OUT1_L, OUT2_H, and OUT2_L. Additionally, the transformer driver module 144 comprises an input voltage terminal VCC and a ground terminal GND.

The input terminals IN_1, EN_1, IN_2, and EN_2 (e.g., four input terminals on an input side) are coupled to the controller 140 for receiving the signals as determined by the cycloconverter control module 192. The input terminals IN_1, EN_1, IN_2, and EN_2 are further coupled to the transformer driver module output terminals OUT1_H, OUT1_L, OUT2_H, and OUT2_L (e.g., four output terminals on an output side) via a plurality of logical AND, NOT, and buffer gates as depicted in FIG. 2. Each of the input terminals IN_1, EN_1, IN_2, and EN_2 is further coupled to the ground terminal GND via a resistor (e.g., 100 kohm).

The input voltage terminal VCC is coupled to each of the buffers and receives a suitable input voltage, e.g., 3.3V, upon application of which the transformer driver module 144 initiates operation.

The output terminals OUT1_H/OUT1_L and OUT2_H/OUT2_L are coupled to the isolation transformers 146-1 and 146-2, respectively, for driving the transformers.

Figure 3:
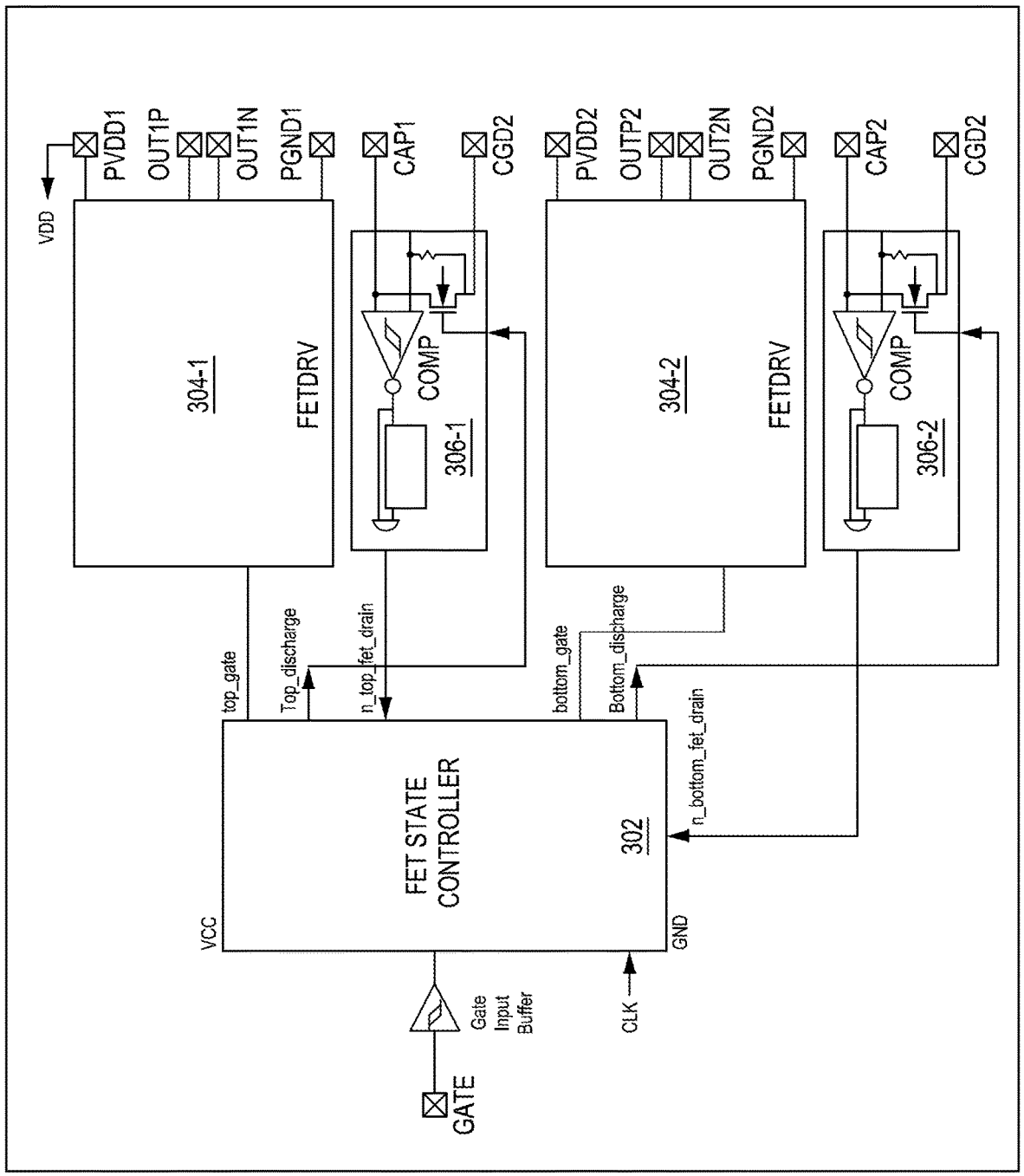
FIG. 3 is a block diagram of a gate driver module in accordance with embodiments of the present disclosure.

FIG. 3 is a block diagram of a gate driver module 148 in accordance with embodiments of the present disclosure. As described above, the gate driver modules 148-1 and 148-2 are coupled to the gate terminals of the switches $108_1$-1/$108_1$-2 and $108_2$-1/$108_2$-2, respectively, as well as the drain voltage sensors 150, and provide the signals to drive the FET switches 108.

The gate driver module 148 comprises an FET state controller module 302, two FET driver modules 304-1 and 304-2, and two comparator modules 306-1 and 306-2. The gate driver module 148 may additionally comprise various support circuits or modules, such as a test mode module, clock circuits (e.g., an RC oscillator module), power and voltage modules for regulating and distributing power to components of the gate driver module 148 (e.g., low dropout regulators (LDO), power-on reset (POR) modules, and the like), various memory (e.g., one-time programmable (OTP) components), safety modules (e.g., a thermal shutdown module), and the like.

The FET state controller module 302 generates signals for controlling the corresponding FET switch pairs (e.g., FET switches 108-1 and 108-2) to create the desired AC output waveform. The FET state controller module 302 is coupled to each of the FET driver modules 304-1 and 304-2 and provides control signals to the respective FET driver module 304-1 and the FET driver module 304-2. Based on the received signals from the FET state controller module 302, the FET driver modules 304-1 and 304-2 generate gate drive signals for driving the corresponding FET switch pair (e.g., FET switches 108-1 and 108-2).

The comparator modules 306-1 and 306-2 receive input signals from the drain voltage sensor 150-1 and the drain voltage sensor 150-2, respectively, and, based on the received signals, determine the corresponding FET drain voltages. The determined drain voltage values are coupled to the FET state controller module 302. Based on the desired gate signal (i.e., the "GATE" input signal to the FET state controller) and the voltage across the FET switches 108-1/108-2, the FET state controller module 302 determines which switch in the FET switches 108-1/108-2 to hold ON during each switching cycle. To eliminate the possibility of a DC buildup on the sense capacitors C1 and C2 of the drain voltage sensor 150-1 and the drain voltage sensor 150-2, the comparator modules 306-1 and 306-2 each receive a discharge signal from the FET state controller module 302, for example for a clock period at the end of the ZVS, as described in detail below with respect to FIGS. 5-8. When the discharge signal from the FET state controller module 302 to a comparator 306 is high, the comparator 306 input from the drain voltage sensor 150 is pulled down to ground; otherwise, when the discharge signal is low, the comparator 306 follows the monitored FET's drain voltage.

Figure 4:
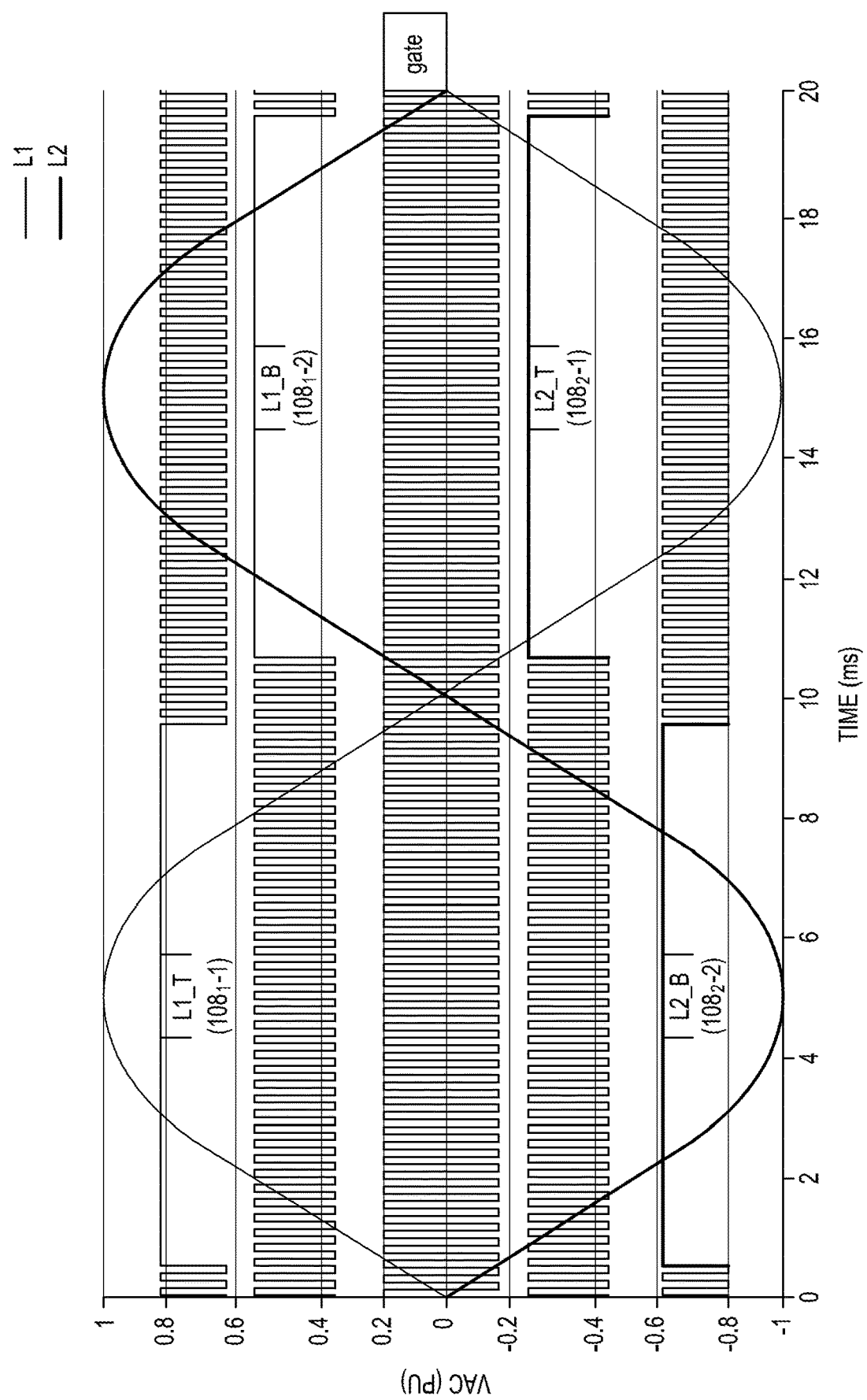
FIG. 4 depicts a visual illustration of FET gate signal reconstruction in accordance with embodiments of the present disclosure.

FIG. 4 depicts a visual illustration of FET gate signal reconstruction in accordance with embodiments of the present disclosure. In the exemplary illustration shown, the waveforms L1_T and L1_B correspond to gate signals coupled to the switches $108_1$-1 and $108_1$-2 (i.e., the 4Q switch 128-1), respectively, and the waveforms L2_T and L2_B correspond to gate signals for the switches $108_2$-1 and $108_2$-2 (i.e., the 4Q switch 128-2), respectively.

As shown in FIG. 4, for each half-cycle of the mains voltage, one of the FET switches 108 in each 4Q switch 128 is ON for nearly all of that mains half-cycle, and, for the next half-cycle of the mains voltage, the other FET switch 108 in each 4Q switch 128 is ON for nearly all of that mains half-cycle. In the embodiment shown in FIG. 4, the switch $108_1$-1 in 128-1 (corresponding to the gate signal L1_T) is continuously ON for almost half a mains cycle, and the switch $108_1$-2 in 128-1 (corresponding to the gate signal L1_B) is continuously ON for almost the entirety of the second half of the mains voltage cycle. By sensing drain voltages after an FET gate is turned OFF—i.e., if they remain near zero or rapidly increase—it is possible for the gate driver module 148 to determine which FET switch in a FET switches 108-1/108-2 should remain ON until the next gate going high. In this way, a "continuously ON for almost half a mains cycle" function is recreated with only one FET gate signal (i.e., the gate signal for the alternate FET switch in the in the 4Q switch 128).

Further, since the recreated gate signal has a 50% duty cycle, the isolation transformer 146 can provide isolation as well as transfer both power and gate signal information (switch signal information), although in other embodiments the duty cycle may be other than 50%.

Figure 5:
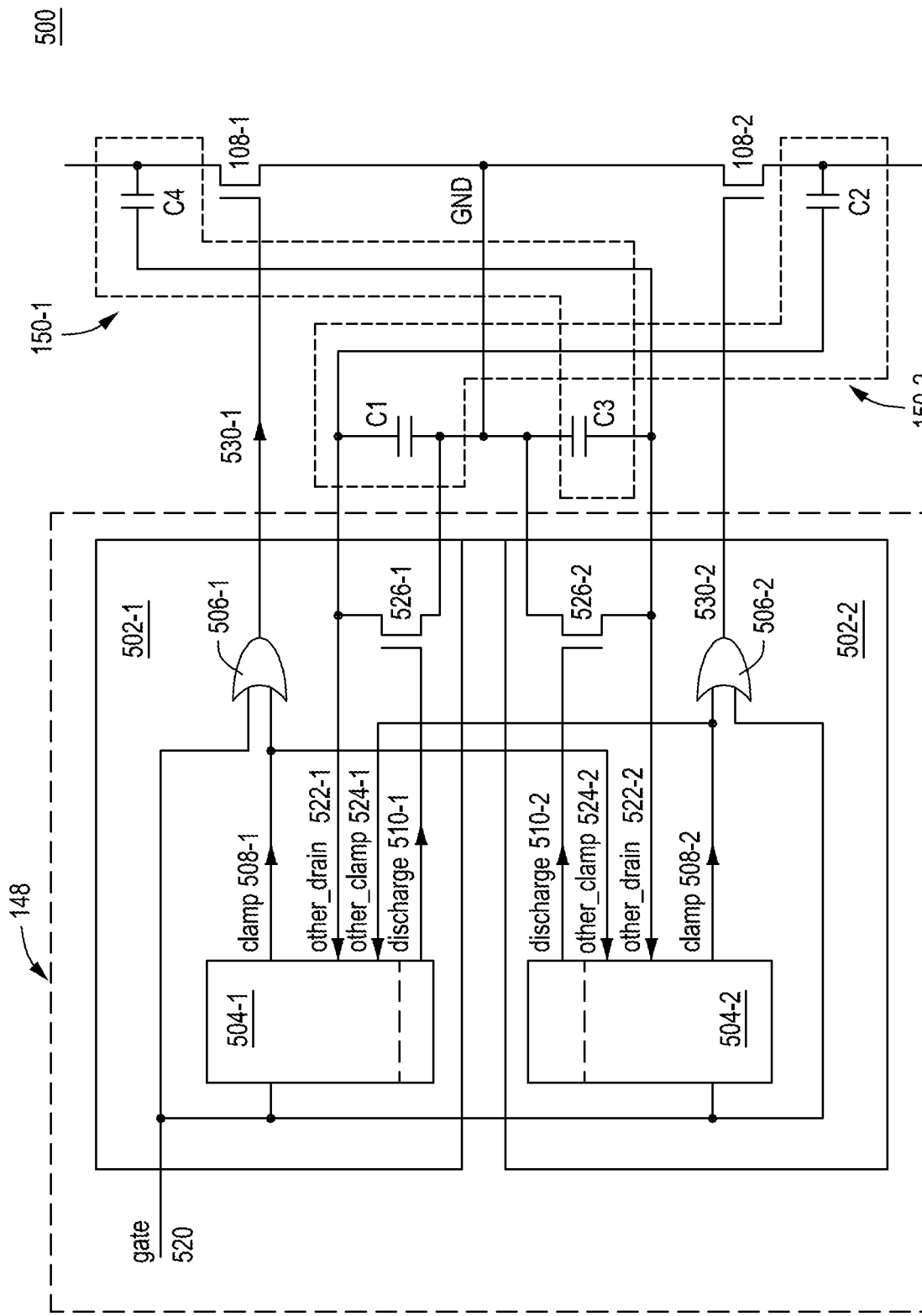
FIG. 5 is a block diagram depicting high-level state machine interaction within a gate driver module in accordance with embodiments of the present disclosure.

FIG. 5 is a state machine interaction diagram 500 depicting high-level state machine interaction within a gate driver module 148 in accordance with embodiments of the present disclosure. The state machine interaction diagram 500 illustrates the interconnection between a state machine 504-1 driving the FET switch 108-1 of a 4Q switch 128 and a state machine 504-2 driving the FET switch 108-2 in the 4Q switch 128. The state machines 504-1 and 504-2 are part of the FET state controller module 302.

A gate signal 520 is received by the FET state controller module 302, from the transformer driver module 144 via the isolation transformer 146 and is coupled to each of the state machines 504-1 and 504-2.

The state machine 504-1 is coupled to the capacitive divider C1/C2 of the drain voltage sensor 150-2 (i.e., the drain voltage sensor of the switch being driven by the state machine 504-2) and receives a signal "other-drain" 522-1 indicating the drain voltage of the FET switch 108-2. The state machine 504-1 further receives a signal "other-clamp" 524-1, from the state machine 504-2, indicating the clamping state of the FET switch being driven by the state machine 504-2 (i.e., the FET switch 108-2). The state machine 504-2 couples the signal other-clamp 524-1 to the state machine 504-1 to inform the state machine 504-1 of the clamping state of the FET switch 108-2—i.e., the clamping state of the FET switch not being driven by the state machine 504-1—in order to ensure that both FET switches 108-1 and 108-2 are never simultaneously in a clamped state.

Based on the received signals, the state machine 504-1 generates a clamp signal 508-1 which, along with the gate signal 520, is coupled to a logical OR gate 506-1; the output from the OR gate 506-1 is coupled to the gate of the FET switch 108-1.

In order to ensure there is no DC voltage build-up on the sense capacitor, a discharge switch 526-1 (e.g., an FET) is coupled across the capacitor C1 of the drain voltage sensor 150-2. The state machine 504-1 generates a discharge signal 510-1 and couples the discharge signal 510-1 to the gate of the discharge switch 526-1. Activating the discharge switch allows the sense capacitor to discharge, ensuring there is no DC voltage build-up on the sense capacitor; under normal operating conditions, voltage across the sense capacitor is expected to be 0 when a discharge switch 526-1 is turned on.

Analogous to the state machine 504-1, the state machine 504-2 is coupled to a capacitive divider C3/C4 of the drain voltage sensor 150-1 (i.e., the drain voltage sensor of the switch being driven by the state machine 504-1) and receives a signal "other-drain" 522-2 indicating the drain voltage of the FET switch 108-1. The state machine 504-2 further receives a signal "other-clamp" 524-2, from the state machine 504-1, indicating the clamping state of the FET switch being driven by the state machine 504-1 (i.e., the FET switch 108-1). The state machine 504-1 couples the signal other-clamp 524-2 to the state machine 504-2 to inform the state machine 504-2 of the clamping state of the FET switch 108-1—i.e., the clamping state of the FET switch not being driven by the state machine 504-2—in order to ensure that both FET switches 108-1 and 108-2 are never simultaneously in a clamped state.

Based on the received signals, the state machine 504-2 generates a clamp signal 508-2 which, along with the gate signal 520, is coupled to a logical OR gate 506-2; the output from the OR gate 506-2 is coupled to the gate of the FET switch 108-2.

In order to ensure there is no DC voltage build-up on the sense capacitor, a discharge switch 526-2 (e.g., an FET) is coupled across the capacitor C3 of the drain voltage sensor 150-1. The state machine 504-2 generates a discharge signal 510-2 and couples the discharge signal 510-2 to the gate of the discharge switch 526-2. Activating the discharge switch allows the sense capacitor to discharge, ensuring there is no DC voltage build-up on the sense capacitor; under normal operating conditions, voltage across the sense capacitor is expected to be 0 when a discharge switch 526-2 is turned on.

Figure 6:
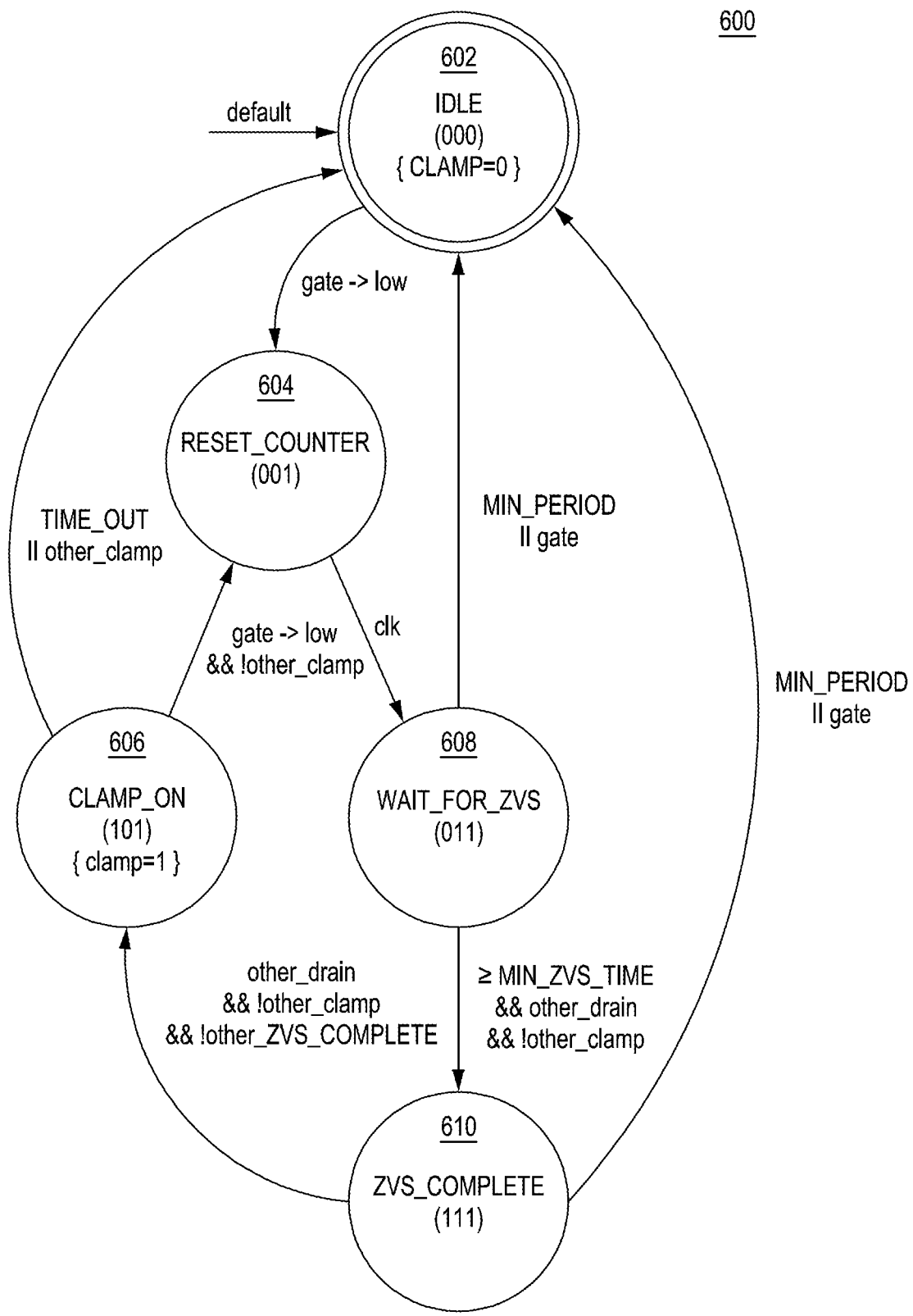
FIG. 6 is a state diagram illustrating operating states and state transition conditions for a state machine in accordance with embodiments of the present disclosure.

In various embodiments, the clamp signal 508-1 and the clamp signal 508-2 are generated as illustrated in the state diagram 600 depicted in FIG. 6. In various embodiments, the discharge signals 510-1/510-2 are generated as illustrated by the state diagram 800 of FIG. 8.

FIG. 6 is a state diagram 600 illustrating operating states and state transition conditions for a state machine 504 in accordance with embodiments of the present disclosure.

During operation, a state machine 504 generates a clamp signal 508 (e.g., on-gate clamp signal) for an FET switch 108 that does not block any voltage (which also may be referred to herein as "clamping FET"), with the clamp signal 508 generally lasting for almost a complete half mains cycle. For a clamp signal 508 to be high, ZVS voltages need to be present within a specified time window (bound by minimum and maximum values). After a defined timeout, the clamp signal 508 is terminated. Additionally, by coupling the from each state machine 504 to the other, an interlock mechanism is provided that prevents both gates of the FET switches 108-1 and 108-2 from being in a clamping state at the same time. Both gate drive outputs are prohibited from being HIGH when the gate signal 520 is LOW.

The various signals utilized in determining the state transitions in the state diagram 600 correspond to signals described above with respect to FIG. 5; in particular, "gate" corresponds to the gate signal 520, "other_drain" corresponds to the signal 522, "other_clamp" corresponds to the signal 524, and "clamp" corresponds to the signal 508.

Further, MIN_PERIOD, MIN_ZVS_TIME, and TIME_OUT in the state diagram 600 refer to the time elapsed from a trailing input gate edge depicted in the timing diagram 700 described below with respect to FIG. 7.

In certain embodiments, a minimum ZVS time (ZVS_MIN) is set at, for example, 2 clock cycles; such a delay reduces a possibility of a false ZVS detection due to noise.

Figure 7:
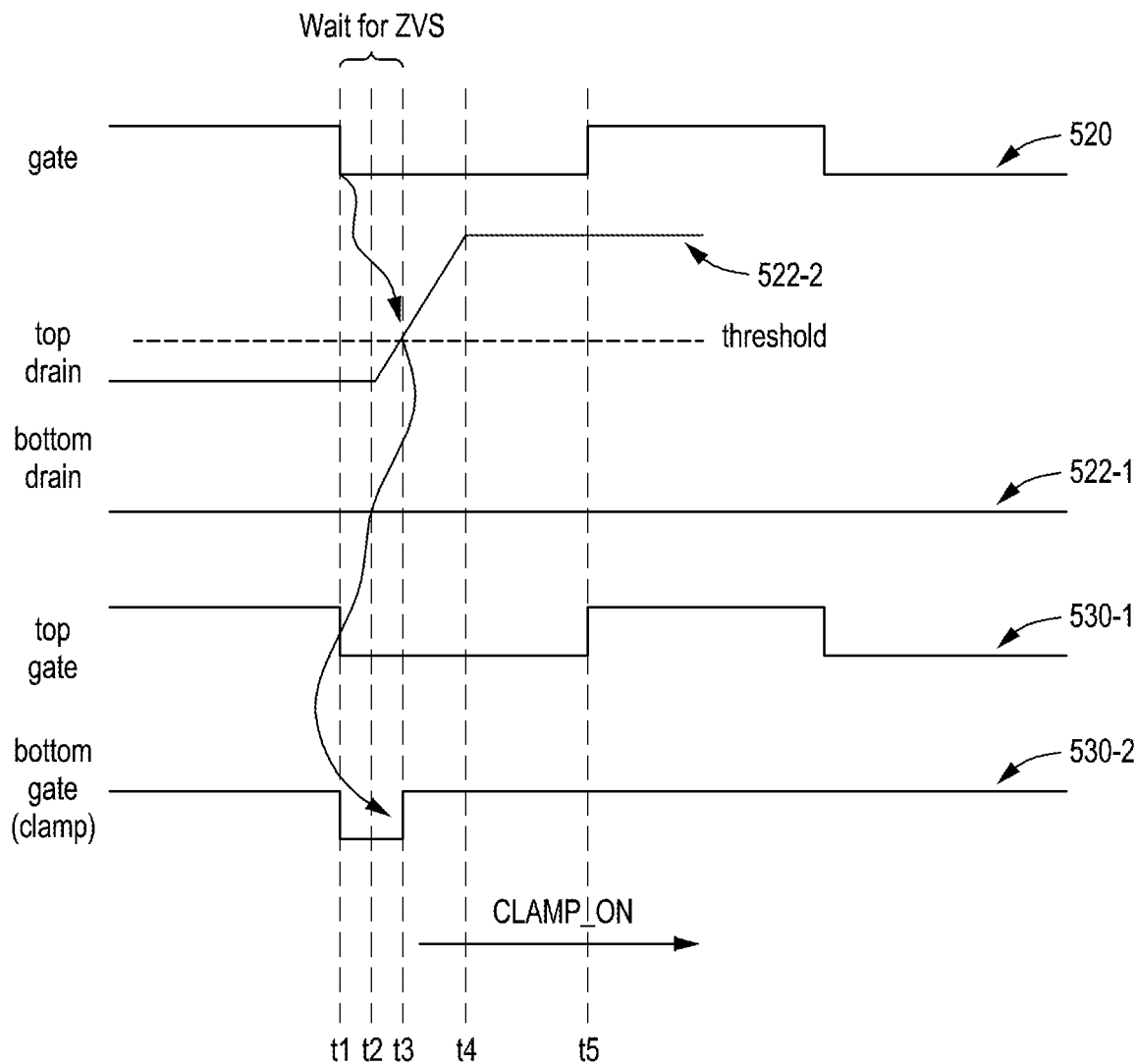
FIG. 7 depicts a timing diagram in accordance with embodiments of the present disclosure.

FIG. 7 depicts a timing diagram 700 in accordance with embodiments of the present disclosure. The timing diagram 700 corresponds to the state diagram 600 and the state machine interaction diagram 500.

The timing diagram 700 depicts, for a period of time in certain embodiments, the gate signal 520, the top drain signal 522-2, the bottom drain signal 522-1, the top gate drive signal 530-1, and the bottom gate drive signal 530-2. The top drain signal 522-2 and the bottom drain signal 522-1 represent the respective drain voltages of the FET switches 108-1 and 108-2. The top gate drive signal 530-1 and the bottom gate drive signal 530-2 represent the respective gate drive signals coupled to the FET switches 108-1 and 108-2.

At a first time t1, the gate signal 520 changes from a high to a low level, and both the top gate drive signal 530-1 and the bottom gate drive signal 530-2 change from high to low. The top drain signal 522-2 and the bottom drain signal 522-1 are both low.

At a time t2, following t1, the top drain signal 522-2 begins to ramp up, while the bottom drain signal 522-1 remains low. The gate signal 520 remains low, as do the top gate drive signal 530-1 and the bottom gate drive signal 530-2.

At a time t3, following t2, the top drain signal 522-2 crosses a threshold; by sensing that the top drain signal 522-2 has increased above a threshold amount subsequent to the gate signal 520 going low at the time t1, while the bottom drain signal 522-1 remains low, the system is able to determine that the bottom FET (i.e., FET switch 108-2) is not blocking any voltage and therefore should be clamped on for a TIME_OUT duration, and the bottom gate drive signal 530-2 transitions to a high level (i.e., "clamp on").

At a time t4, following t3, the top drain signal 522-2 reaches a high level and remains high. At the time t4, the gate signal 520, the bottom drain signal 522-1, and the top gate drive signal 530-1 all remain low; the bottom gate drive signal 530-2 remains high.

At a time t5, following t4, the top drain signal 522-2 remains high and the bottom drain signal 522-1 remains low; the gate signal 520 and the top gate drive signal 530-1 transition from low to high, while the bottom gate drive signal 530-2 remains high, as it has been since t3.

Figure 8:
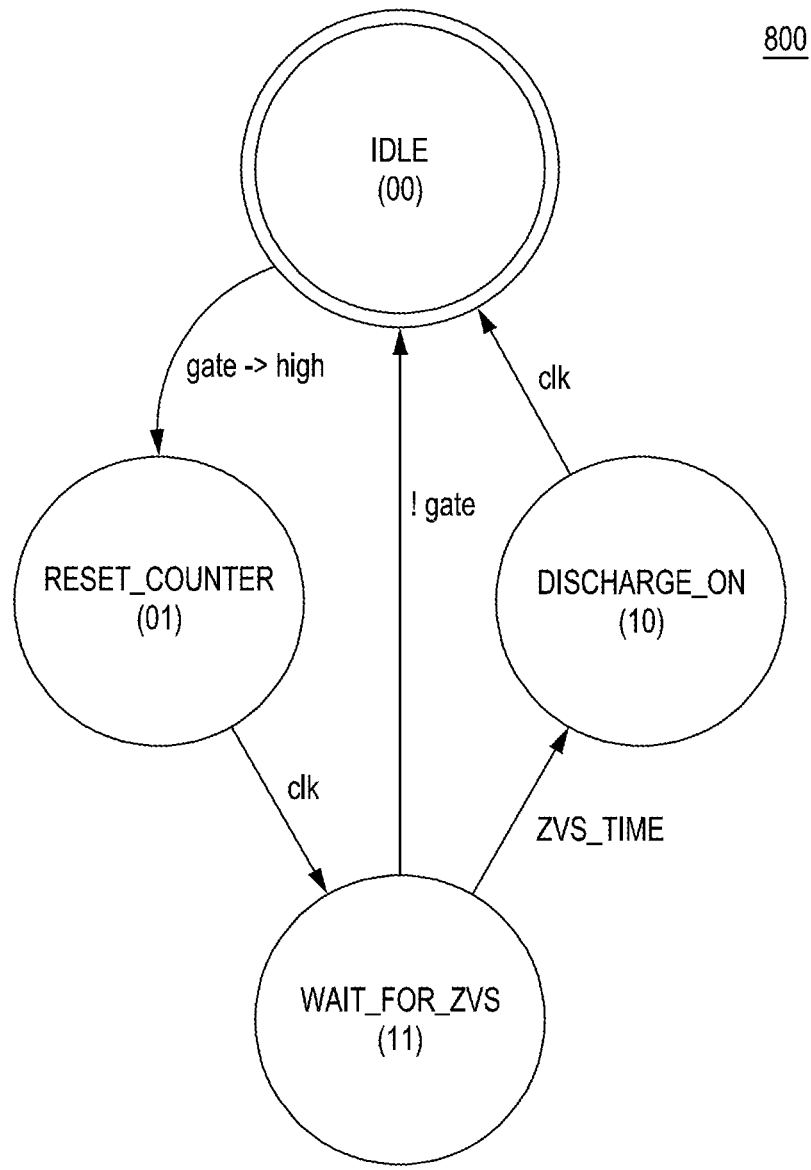
FIG. 8 is a state diagram illustrating operating states and state transition conditions for a state machine controlling the generation of the discharge signals in accordance with embodiments of the present disclosure.

FIG. 8 is a state diagram 800 illustrating operating states and state transition conditions for a state machine controlling the generation of the discharge signals 510 in accordance with embodiments of the present disclosure. In one or more embodiments, the state diagram 800 may be implemented by a simple state machine (which may be part of the state machine 504) that provides a pulse, for example 1 clock wide, to discharge a sense capacitor by activating the corresponding discharge switch. Under normal operating conditions, voltage across the sense capacitor is expected to return to 0V (on its own) on the next high-to-low ZVS transition. The discharge switch 526 is turned on soon after, to guarantee the voltage is 0V.

The signal names shown in the state diagram 800 correspond to the signals described above with respect to the state diagram 600; in various embodiments, the parameter settings shown in the state diagram are the same as those with respect to the state diagram 600, except for ZVS_TIME which may be set at, for example, 9 clocks. The CLK signal may be generated by an RC oscillator circuit, an external crystal/oscillator, or the like.

Figure 9:
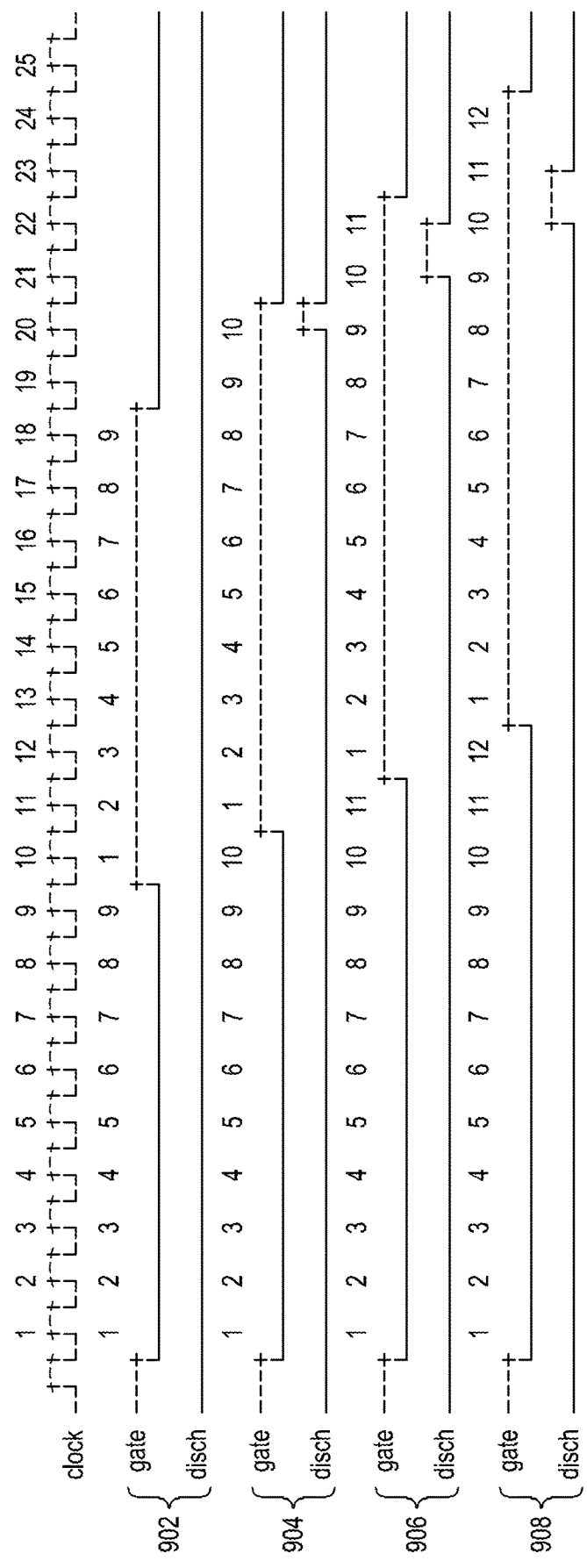
FIG. 9 depicts the expected timing for four different switching frequencies.

The expected timing for four different switching frequencies (gate and discharge signals 902, 904, 906, and 908) is depicted in FIG. 9.

Figure 10:
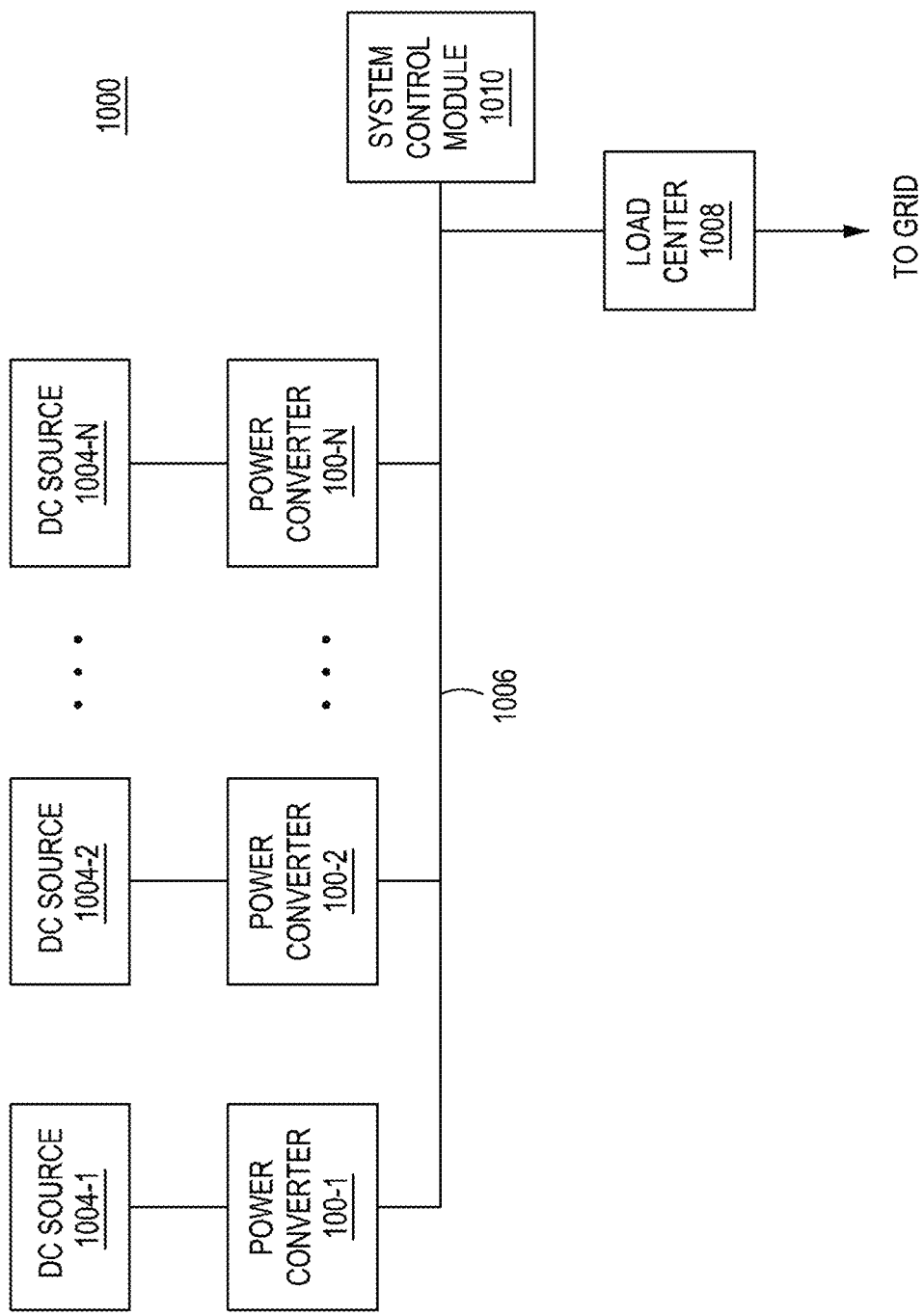
FIG. 10 is a block diagram of a system for distributed generation (DG) in accordance with one or more embodiments of the present disclosure.

FIG. 10 is a block diagram of a system 1000 for distributed generation (DG) in accordance with one or more embodiments of the present disclosure. This diagram only portrays one variation of the myriad of possible system configurations. The present disclosure can function in a variety of distributed power generation environments and systems.

The system 1000 comprises a plurality of power converters $100_1$, $100_2$ ... $100_n$, collectively referred to as power converters 100, a plurality of DC sources $1004_1$, $1004_2$ ... $1004_n$, collectively referred to as DC sources 1004, an AC bus 1006, a load center 1008, and a system control module 1010.

Each power converter $100_1$, $100_2$ ... $100_n$ is coupled to a DC source $1004_1$, $1004_2$ ... $1004_n$, respectively, in a one-to-one correspondence and converts DC power from the corresponding DC source to AC power. The DC sources 1004 may be any suitable source of DC power, such as photovoltaic (PV) modules, wind turbines, hydroelectric systems, batteries, and the like. In some embodiments, one or more of the power converters 100 may be coupled to multiple DC sources; for example, each of the power converters 100 may be coupled to two PV modules.

The power converters 100 are coupled to the AC bus 1006, along with the system control module 1010 and the load center 1008. The system control module 1010 is capable of communicating with the power converters 100 (e.g., via power line communications), for example for issuing command and control signals to the power converters 100 and/or for receiving information from the power converters 100. In some embodiments, the system control module 1010 may be a gateway for receiving information from and/or sending information to another device (such as a remote master controller), for example via the Internet. In such embodiments, the system control module 1010 may communicate information pertaining to the power converters 100 (e.g., performance data) to a remote master controller, and/or communicate data from the remote master controller (e.g., control commands) to one or more of the power converters 100.

The load center 1008 houses connections between incoming power lines from a power grid distribution system (such as a commercial grid) and the AC bus 1006.

The power converters 100 convert DC power from the DC sources 1004 into AC power that is power grid compliant and couple the generated AC power to the grid via the load center 1008. Additionally or alternatively, the generated power may be distributed for use via the load center 1008 to one or more appliances, and/or the generated energy may be stored for later use, for example using batteries, heated water, hydro pumping, $H_2O$-to-hydrogen conversion, or the like.

Each of the power converters 100 comprises the components previously described in detail, which include the cycloconverter 160 along with the isolated gate driver system 162 and the drain voltage sensors 150 for driving the cycloconverter switches as described here.

Figure 11:
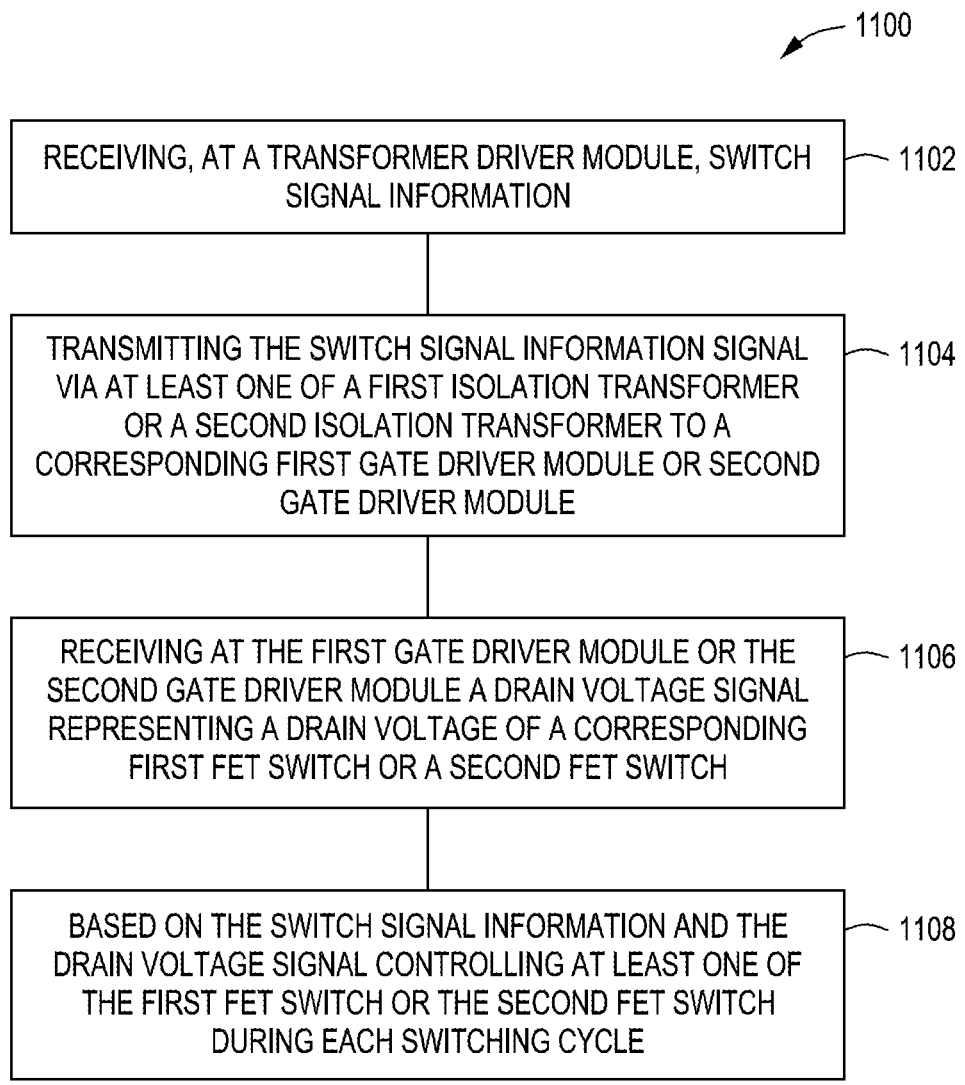
FIG. 11 is a flowchart of a method for controlling a power converter in accordance with one or more embodiments of the present disclosure.

FIG. 11 is a flowchart of a method 1100 for controlling a power converter in accordance with one or more embodiments of the present disclosure. For example, the method 1100 can be used to control the power converter 100.

At 1102, the method 1100 comprises receiving, at a transformer driver module, switch signal information. For example, the controller 140 can transmit a gate signal to the transformer driver module.

Next, at 1104, the method 100 comprises transmitting the switch signal information signal via at least one of a first isolation transformer or a second isolation transformer to a corresponding first gate driver module or second gate driver module. For example, the switch signal information signal can be transmitted via the isolation transformer 152 and received by the FET state controller module 302 of the gate driver module 148.

Next, at 1106, the method 1100 comprises receiving at the first gate driver module or the second gate driver module a drain voltage signal representing a drain voltage of a corresponding first FET switch or a second FET switch. For example, the drain voltage sensors 150 can transmit a drain voltage of a FET switch 108 to the FET state controller 302.

Next, at 1108, the method 1100 comprises, based on the switch signal information and the drain voltage signal, controlling at least one of the first FET switch or the second FET switch during each switching cycle. For example, as noted above, the FET state controller module 302 determines which switch in the FET switches 108-1/108-2 to hold ON during each switching cycle.

While the foregoing is directed to embodiments of the present disclosure, other and further embodiments of the disclosure may be devised without departing from the basic scope thereof, and the scope thereof is determined by the claims that follow.

The invention claimed is:

1. A system for driving four-quadrant (4Q) switches of a power converter, comprising:
a transformer driver module;
a first gate driver module and a second gate driver module coupled to the transformer driver module via a first isolation transformer and a second isolation transformer, respectively, for receiving both switch signal information and power; and
a first bidirectional switch coupled to the first gate driver module and a second bidirectional switch coupled to the second gate driver module, wherein the first bidirectional switch and the second bidirectional switch are coupled to one another, and wherein the first gate driver module is configured to drive the first bidirectional switch and the second gate driver module is configured to drive the second bidirectional switch.

2. The system of claim 1, wherein each of the first bidirectional switch and the second bidirectional switch comprises a pair of FET switches.

3. The system of claim 1, wherein the transformer driver module is coupled to a primary winding of each of the first isolation transformer and the second isolation transformer via a corresponding capacitor.

4. The system of claim 1, wherein the transformer driver module comprises four input terminals, four output terminals, an input voltage terminal on an input side of the transformer driver module, and a ground terminal on an output side of the transformer driver module.

5. The system of claim 4, wherein the four input terminals are coupled to the four output terminals via a plurality of logical AND, NOT, and buffer gates, and wherein each of the four input terminals are coupled to the ground terminal via a corresponding resistor.

6. The system of claim 5, wherein the input voltage terminal is coupled to each of the buffer gates and receives an input voltage to initiate operation of the transformer driver module.

7. The system of claim 4, wherein the four input terminals are coupled to a controller for receiving and coupling signals corresponding to desired switching states.

8. The system of claim 4, wherein the four output terminals are coupled to the first isolation transformer and the second isolation transformer for driving the first isolation transformer and the second isolation transformer.

9. The system of claim 1, wherein the first gate driver module and the second gate driver module are coupled to respective gate terminals of FET switch pairs of the first bidirectional switch and to respective gate terminals of FET switch pairs of the second bidirectional switch to provide signals to drive the FET switch pairs.

10. The system of claim 9, wherein each of the first gate driver module and the second gate driver module comprises a FET state controller module, two FET driver modules, and two comparator modules.

11. The system of claim 10, wherein each FET state controller module generates signals for controlling corresponding FET switch pairs to create a desired AC output waveform.

12. The system of claim 10, wherein each FET state controller module is coupled to corresponding FET driver modules for providing control signals to the corresponding FET driver modules, and wherein based on the control signals received from each of the FET state controller modules, the corresponding FET driver modules generate gate drive signals for driving the corresponding FET switch pairs.

13. The system of claim 10, wherein the comparator modules receive input signals from corresponding drain voltage sensors and, based on the received input signals, determine corresponding FET drain voltages of the FET switch pairs, and wherein the determined FET drain voltages are coupled to each corresponding FET state controller module and used to determine which of the FET switch pairs to hold on during a switching cycle.

14. The system of claim 1, further comprising a first drain voltage sensor and a second drain voltage sensor coupled to the first bidirectional switch and the second bidirectional switch, respectively, for sensing a drain voltage of the first bidirectional switch and the second bidirectional switch, respectively, and coupling a sensed drain voltage of the first bidirectional switch and the second bidirectional switch to each respective gate driver module for determining switching signaling.

15. A power converter, comprising:
a low-voltage side and a high voltage side separated by a transformer;
an isolated gate driver system connected to the low-voltage side via a controller and to the high voltage side, the isolated gate driver system comprising:
a transformer driver module that connects to the controller; and
a first gate driver module and a second gate driver module connected to a cycloconverter on the high voltage side and coupled to the transformer driver module via a first isolation transformer and a second isolation transformer, respectively, for receiving both switch signal information and power; and
a first bidirectional switch coupled to the first gate driver module and a second bidirectional switch coupled to the second gate driver module, wherein the first bidirectional switch and the second bidirectional switch are coupled to one another, and wherein the first gate driver module is configured to drive the first bidirectional switch and the second gate driver module is configured to drive the second bidirectional switch.

16. The power converter of claim 15, wherein the power converter is a single-phase bidirectional DC-AC converter.

17. The power converter of claim 15, wherein each of the first bidirectional switch and the second bidirectional switch comprises a pair of FET switches.

18. The power converter of claim 15, wherein the transformer driver module is coupled to a primary winding of each of the first isolation transformer and the second isolation transformer via a corresponding capacitor.

19. The power converter of claim 15, wherein the transformer driver module comprises four input terminals, four output terminals, an input voltage terminal on an input side of the transformer driver module, and a ground terminal on an output side of the transformer driver module.

20. A method for controlling a power converter, comprising:
receiving, at a transformer driver module of an isolated gate driver system connected to a low-voltage side via a controller and to a high voltage side of the power converter, switch signal information;
transmitting the switch signal information signal via at least one of a first isolation transformer or a second isolation transformer connected to a corresponding first gate driver module or second gate driver module, wherein the first gate driver module and the second gate driver module are connected to a cycloconverter on the high voltage side and coupled to the transformer driver module via the first isolation transformer and a second isolation transformer, respectively, for receiving both the switch signal information and power;
receiving at the first gate driver module or the second gate driver module a drain voltage signal representing a drain voltage of a corresponding first bidirectional switch coupled to the first gate driver module or a second bidirectional switch coupled to the second gate driver module, wherein the first bidirectional switch and the second bidirectional switch are coupled to one another, and wherein the first gate driver module is configured to drive the first bidirectional switch and the second gate driver module is configured to drive the second bidirectional switch; and
based on the switch signal information and the drain voltage signal, controlling at least one of the first bidirectional switch or the second bidirectional switch during each switching cycle.

* * * * *